United States Patent
Walter

(10) Patent No.: US 8,240,620 B2
(45) Date of Patent: Aug. 14, 2012

(54) ROUTING ASSEMBLY FOR WIRES IN ELECTRONIC ASSEMBLIES AND THE LIKE

(75) Inventor: Thomas Alan Walter, Ellicott City, MD (US)

(73) Assignee: Ciena Corporation, Linthicum, MD (US)

( * ) Notice: Subject to any disclaimer, the term of this patent is extended or adjusted under 35 U.S.C. 154(b) by 46 days.

(21) Appl. No.: 12/546,286

(22) Filed: Aug. 24, 2009

(65) Prior Publication Data
US 2011/0042529 A1    Feb. 24, 2011

(51) Int. Cl.
*F16L 3/22*    (2006.01)
(52) U.S. Cl. ........... 248/68.1; 248/75; 174/146; 24/16 R
(58) Field of Classification Search .......... 248/68.1, 248/75, 56, 62, 50, 51, 53, 63, 48.1, 55, 52, 248/59, 60, 67.5, 67.7, 74.4, 79; 24/16 R; 174/146, 28, 27, 68.1, 68.3, 72 A, 88 R, 40 CC, 174/95
See application file for complete search history.

(56) References Cited

U.S. PATENT DOCUMENTS

| | | | | | |
|---|---|---|---|---|---|
| 277,374 | A | * | 5/1883 | Strohm | 174/111 |
| 289,164 | A | * | 11/1883 | Strohm | 174/111 |
| 2,182,847 | A | * | 12/1939 | Johnson | 361/826 |
| 2,888,546 | A | * | 5/1959 | Kinney | 392/441 |
| 2,902,821 | A | * | 9/1959 | Kelly, Jr. | 59/80 |
| 2,983,014 | A | * | 5/1961 | Greenwood | 24/545 |
| 3,136,515 | A | * | 6/1964 | Potruch | 248/62 |
| 4,366,939 | A | * | 1/1983 | McMillan | 248/68.1 |
| 4,715,571 | A | * | 12/1987 | Soltow et al. | 248/68.1 |
| D298,355 | S | * | 11/1988 | Young | D24/128 |
| 5,027,478 | A | * | 7/1991 | Suhr | 24/16 R |
| 5,216,579 | A | | 6/1993 | Basara et al. | |
| 5,286,919 | A | | 2/1994 | Benson et al. | |
| D358,545 | S | * | 5/1995 | Price | D8/356 |
| 5,481,939 | A | * | 1/1996 | Bernardini | 74/502.4 |
| 5,742,982 | A | * | 4/1998 | Dodd et al. | 24/16 R |
| 6,219,235 | B1 | | 4/2001 | Diaz et al. | |
| 6,396,989 | B1 | * | 5/2002 | Johnston et al. | 385/134 |
| 6,500,666 | B1 | * | 12/2002 | Clements-Macak et al. | 435/303.3 |
| 6,540,312 | B1 | | 4/2003 | Lane | |
| 6,552,270 | B1 | * | 4/2003 | Heacox | 174/71 R |
| 6,629,675 | B1 | | 10/2003 | Bjorklund et al. | |
| 7,070,459 | B2 | * | 7/2006 | Denovich et al. | 439/719 |
| 7,163,180 | B2 | | 1/2007 | Sivahop | |
| 7,293,746 | B2 | * | 11/2007 | Brundage | 248/68.1 |
| 7,410,134 | B2 | | 8/2008 | Sivahop | |
| 7,447,036 | B2 | * | 11/2008 | Soeda et al. | 361/724 |
| 7,462,779 | B2 | * | 12/2008 | Caveney et al. | 174/68.1 |
| 7,479,045 | B1 | | 1/2009 | Biro et al. | |
| 7,592,543 | B2 | * | 9/2009 | Caveney et al. | 174/68.1 |
| 2005/0189453 | A1 | | 9/2005 | DeGuevara | |
| 2007/0054528 | A1 | * | 3/2007 | Caveney et al. | 439/244 |
| 2007/0120023 | A1 | * | 5/2007 | Martinez et al. | 248/75 |
| 2007/0246613 | A1 | * | 10/2007 | Kennedy | 248/56 |

* cited by examiner

Primary Examiner — Kimberly Wood
(74) Attorney, Agent, or Firm — Clements Bernard PLLC; Christopher L. Bernard; Lawrence A. Baratta, Jr.

(57) ABSTRACT

The present invention provides an assembly for routing and retaining wires or cables in an electronic assembly or the like, including: an elongate member; and a plurality of annular structures disposed in a spaced apart relationship about the elongate member, wherein each of the plurality of annular structures defines a plurality of channels about its circumference, wherein each of the plurality of channels is configured to receive and retain a wire or cable.

18 Claims, 5 Drawing Sheets

ROUTING ASSEMBLY FOR WIRES IN ELECTRONIC ASSEMBLIES AND THE LIKE

FIELD OF THE INVENTION

The present invention relates generally to a routing assembly for wires in electronic assemblies and the like. More specifically, the present invention relates to a rotary wire loom assembly for routing and retaining high power wires in electronic assemblies and the like. This rotary wire loom assembly serves to organize, separate, protect, and isolate the high power wires, allowing them to be packaged very densely.

BACKGROUND OF THE INVENTION

Conventionally, in electronic assemblies and the like, high power wires are simply routed from point A to point B and "zip-tied" to one another and to anchor points along their path. Disadvantageously, this leads to disorganized wires that are not adequately and/or effectively separated from one another (e.g. power supply wires from return wires). This also leads to wires that chaff against one another, as well as against sharp objects. This further leads to high current wires that are inadequately isolated from one another—resulting in interference and heat build up that impacts the efficiency of power delivery, for example. One considerable challenge in dealing with high power and high current wiring is that such wiring is typically heavy and stiff, and, therefore, difficult to manipulate.

Thus, what is needed in the art is an improved routing assembly for wires in electronic assemblies and the like.

BRIEF SUMMARY OF THE INVENTION

In various exemplary embodiments, the present invention provides a rotary wire loom assembly for routing and retaining high power wires in electronic assemblies and the like. This rotary wire loom assembly serves to organize, separate, protect, and isolate the high power wires, allowing them to be packaged very densely.

In one exemplary embodiment, the present invention provides an assembly for routing and retaining wires or cables in an electronic assembly or the like, including: an elongate member; and a plurality of annular structures disposed in a spaced apart relationship about the elongate member, wherein each of the plurality of annular structures defines a plurality of channels about its circumference, wherein each of the plurality of channels is configured to receive and retain a wire or cable. Preferably, the elongate member is disposed within an electronic assembly. Essentially, each of the plurality of annular structures is a rotary wire loom. Optionally, each of the plurality of annular structures defines an interior surface that is sized and shaped to anti-rotationally engage a corresponding exterior surface of the elongate member. Optionally, each of the plurality of channels has a substantially circular cross-sectional shape with an opening at the circumference of the corresponding annular structure. Preferably, each of the plurality of channels has a diameter that is slightly smaller than the corresponding diameter of the wire or cable.

In another exemplary embodiment, the present invention provides a method for providing an assembly for routing and retaining wires or cables in an electronic assembly or the like, including: providing an elongate member; and providing a plurality of annular structures disposed in a spaced apart relationship about the elongate member, wherein each of the plurality of annular structures defines a plurality of channels about its circumference, wherein each of the plurality of channels is configured to receive and retain a wire or cable. Preferably, the elongate member is disposed within an electronic assembly. Essentially, each of the plurality of annular structures is a rotary wire loom. Optionally, each of the plurality of annular structures defines an interior surface that is sized and shaped to anti-rotationally engage a corresponding exterior surface of the elongate member. Optionally, each of the plurality of channels has a substantially circular cross-sectional shape with an opening at the circumference of the corresponding annular structure. Preferably, each of the plurality of channels has a diameter that is slightly smaller than the corresponding diameter of the wire or cable.

In a further exemplary embodiment, the present invention provides an electronic assembly, including: an assembly for routing and retaining wires or cables, including: an elongate member; and a plurality of annular structures disposed in a spaced apart relationship about the elongate member, wherein each of the plurality of annular structures defines a plurality of channels about its circumference, wherein each of the plurality of channels is configured to receive and retain a wire or cable. Preferably, the elongate member is disposed within a housing of the electronic assembly. Essentially, each of the plurality of annular structures is a rotary wire loom. Optionally, each of the plurality of annular structures defines an interior surface that is sized and shaped to anti-rotationally engage a corresponding exterior surface of the elongate member. Optionally, each of the plurality of channels has a substantially circular cross-sectional shape with an opening at the circumference of the corresponding annular structure. Preferably, each of the plurality of channels has a diameter that is slightly smaller than the corresponding diameter of the wire or cable.

BRIEF DESCRIPTION OF THE DRAWINGS

The present invention is illustrated and described herein with reference to the various drawings, in which like reference numbers are used to denote like assembly components, as appropriate, and in which.

DETAILED DESCRIPTION OF THE INVENTION

Again, in various exemplary embodiments, the present invention provides a rotary wire loom assembly for routing and retaining high power wires in electronic assemblies and the like. This rotary wire loom assembly serves to organize, separate, protect, and isolate the high power wires, allowing them to be packaged very densely.

Figure 1:
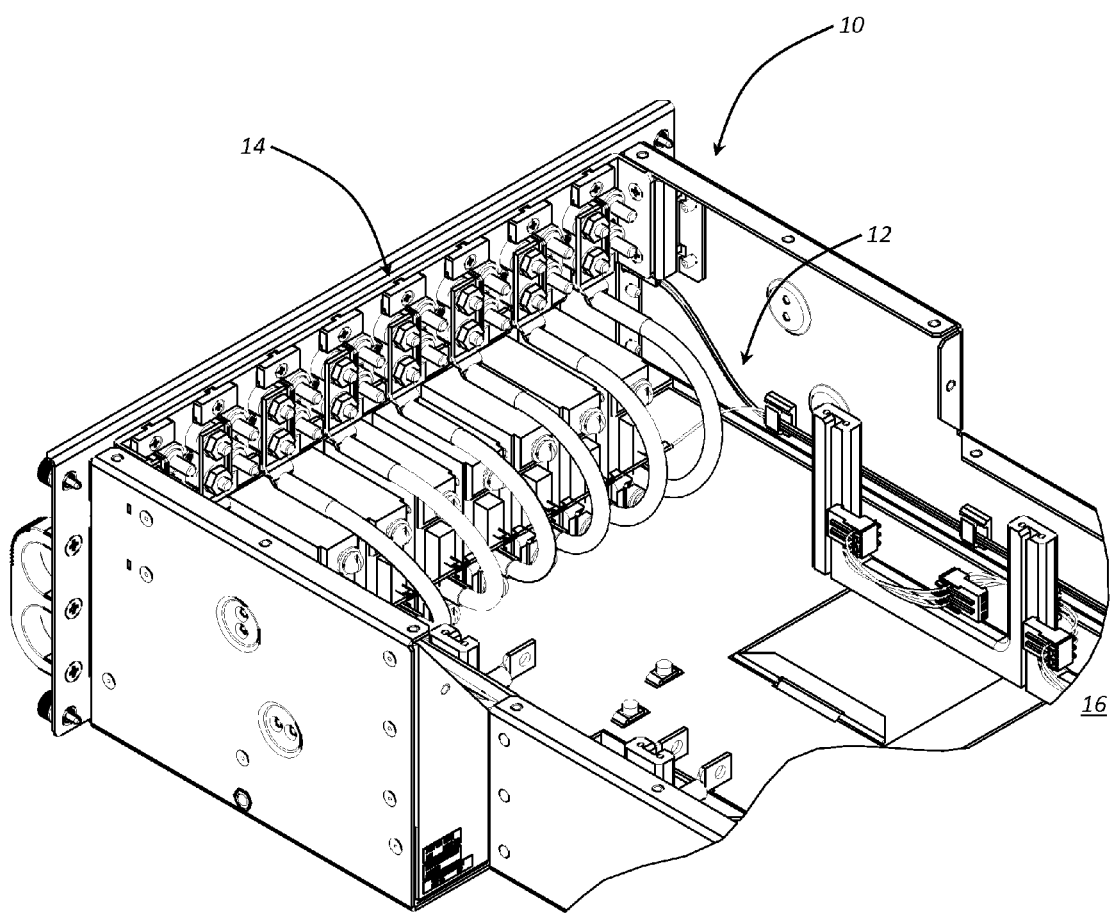
FIG. 1 is a perspective diagram illustrating one exemplary embodiment of a densely packaged power distribution unit (PDU) that is configured to handle eight individual power feeds that must be logically organized as they are routed from the front panel to their respective filter boards.

FIG. 1 is a perspective diagram illustrating one exemplary embodiment of a densely packaged power distribution unit (PDU) 10 that is configured to handle eight individual power feeds 12 (the relative positions of which are illustrated in FIG. 1) that must be logically organized as they are routed from the front panel 14 to their respective filter boards 16 (the relative positions of which are illustrated in FIG. 1). It will be readily apparent to those of ordinary skill in the art that the contributions of the present invention may be utilized in conjunction with an electronic assembly other than the PDU 10, with wires or cables other than the power feeds 12, and between components other than the front panel 14 and the filter boards 16, these contributions being flexible and robust.

Figure 2:
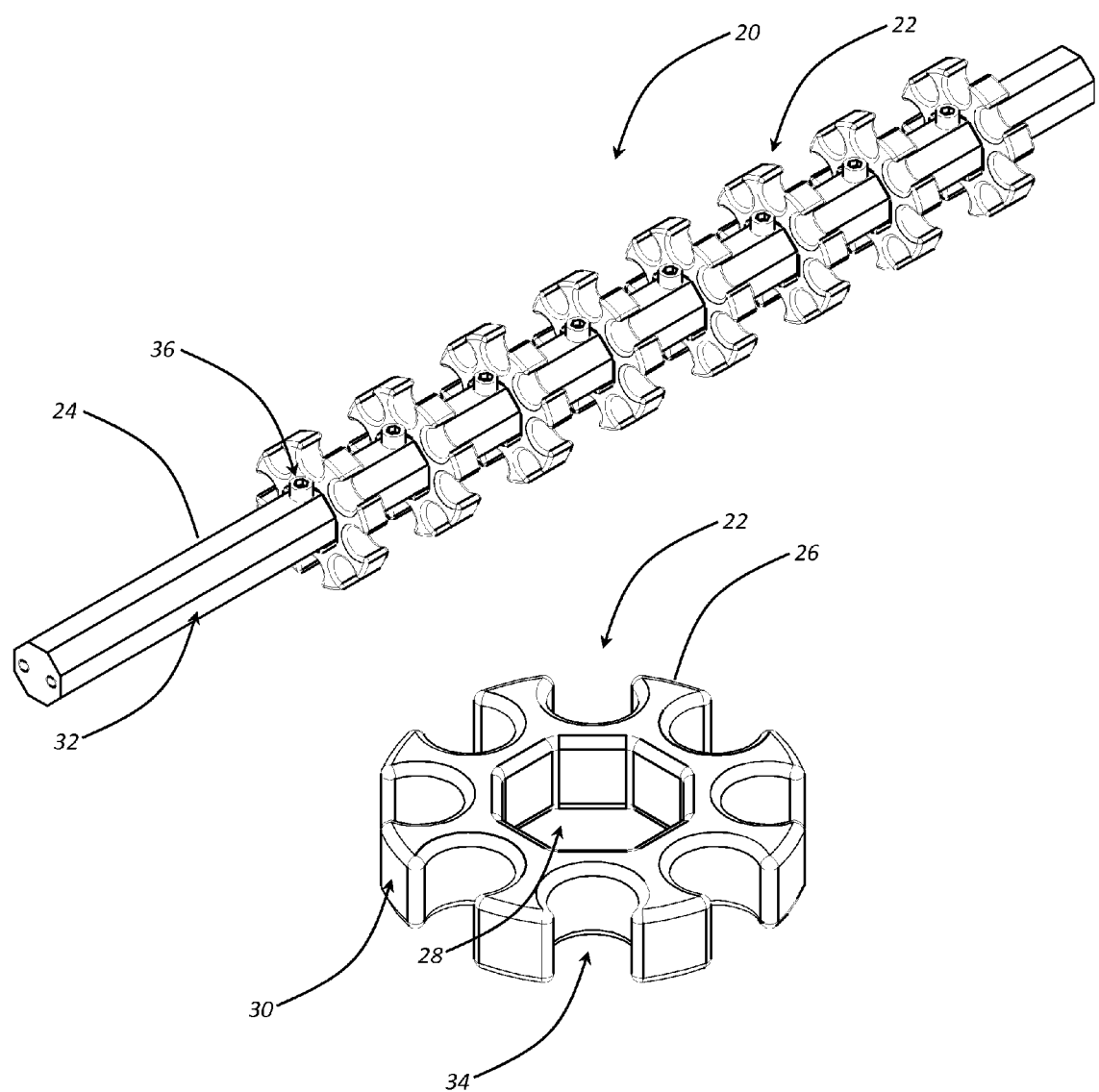
FIG. 2 is a perspective diagram of one exemplary embodiment of the rotary wire loom assembly of the present invention, highlighting the rotary wire looms and the elongate member that make up the rotary wire loom assembly.

FIG. 2 is a perspective diagram of one exemplary embodiment of the rotary wire loom assembly 20 of the present invention, highlighting the rotary wire looms 22 and the elongate member 24 that make up the rotary wire loom assembly 20. Each of the rotary wires looms 22 includes an annular structure 26 defining and having a primary inside surface and diameter 28 and a primary outside surface and diameter 30. The primary inside surface and diameter 28 may have any suitable dimension and shape for mating with a corresponding primary outside surface and diameter 32 of the elongate member 24 (substantially octagonal surfaces and diameters are illustrated in FIG. 2). Preferably, the primary outside surface and diameter 30 of the annular structure 26 defines and includes a plurality of channels 34 configured to receive and retain the power feeds 12 or any other wires or cables of interest. Although substantially circular channels 34 are illustrated in FIG. 2, it will be readily apparent to those of ordinary skill in the art that other cross-sectional shapes may be utilized. Preferably, the primary diameter of each of the channels 34 is slightly smaller than the primary diameter of the insulation of each of the power feeds 12 or other wires or cables of interest so that each of the power feeds 12 or other wires or cables of interest is securely retained in the corresponding channel 34 of the annular structure 26. The annular structures 26 may be made of a metal, an impact resistant plastic, a ceramic, or any other suitable material. The elongate member 24 is slid through the primary inside surface and diameter 28 of each of the annular structures 26, and the relative position of each of the annular structures is selected and fixed using a screw 36, bushing (not illustrated in FIG. 2), and/or the like. Preferably, the retention member utilized does not interfere with the desired routing of any wire or cable. The elongate member 24 may also be made of a metal, an impact resistant plastic, a ceramic, or any other suitable material.

Figure 3:
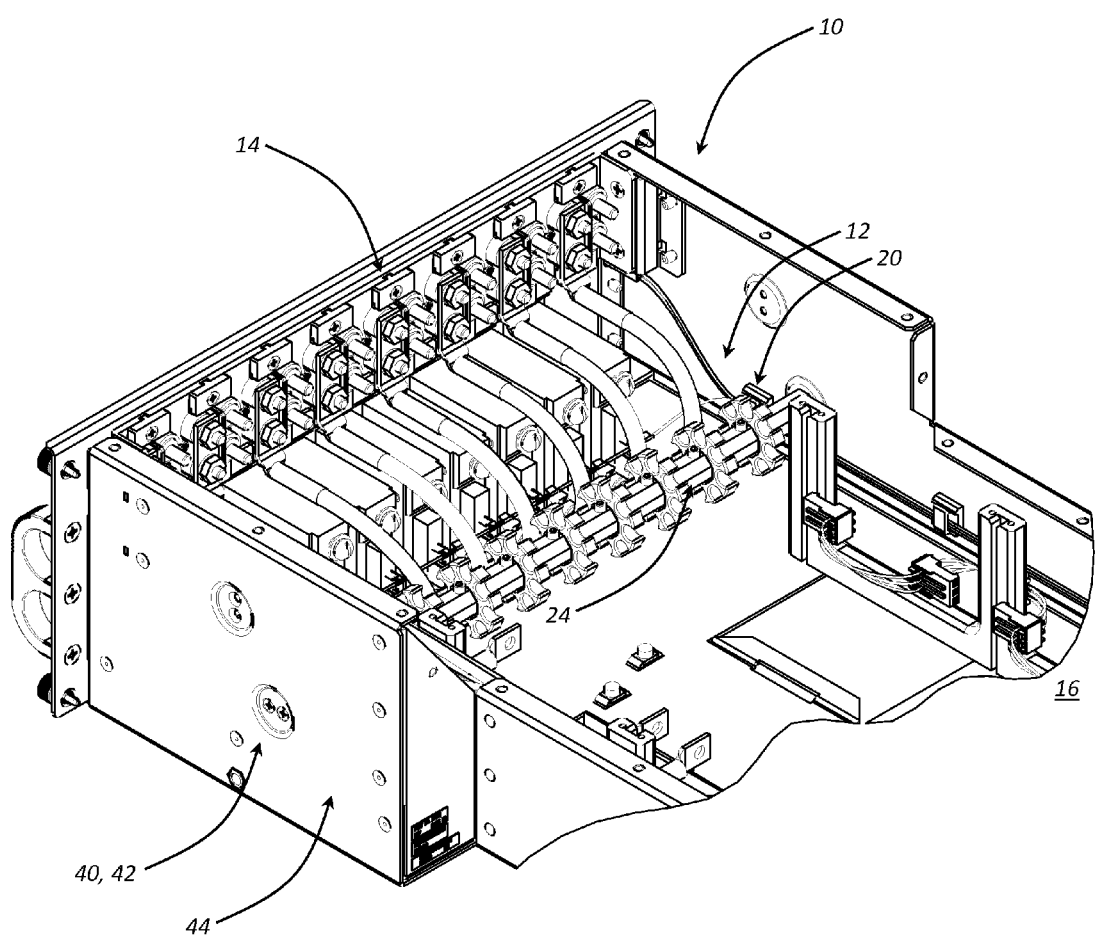
FIG. 3 is a perspective diagram illustrating one exemplary embodiment of the rotary wire loom assembly of FIG. 2 packaged in the PDU of FIG. 1.

FIG. 3 is a perspective diagram illustrating one exemplary embodiment of the rotary wire loom assembly 20 of FIG. 2 packaged in the PDU 10 of FIG. 1. In general, the rotary wire loom assembly 20 is disposed within the PDU 10 or other electronic assembly or the like and oriented in a direction that is conducive to routing wires or cables as desired. In the exemplary embodiment illustrated, the rotary wire loom assembly 20 spans the PDU 10 from side to side, and is anchored at each side via a raised receiving platform 40 and one or more retention screws 42 that are disposed through the housing 44 of the PDU 10 and into the elongate member 24 of the rotary wire loom assembly 20. It will be readily apparent to those of ordinary skill in the art that other retention mechanisms may also be used to hold the rotary wire loom assembly 20 in a given electronic assembly or the like, provided again that the desired routing of the wires or cables is not interfered with.

Figure 4:
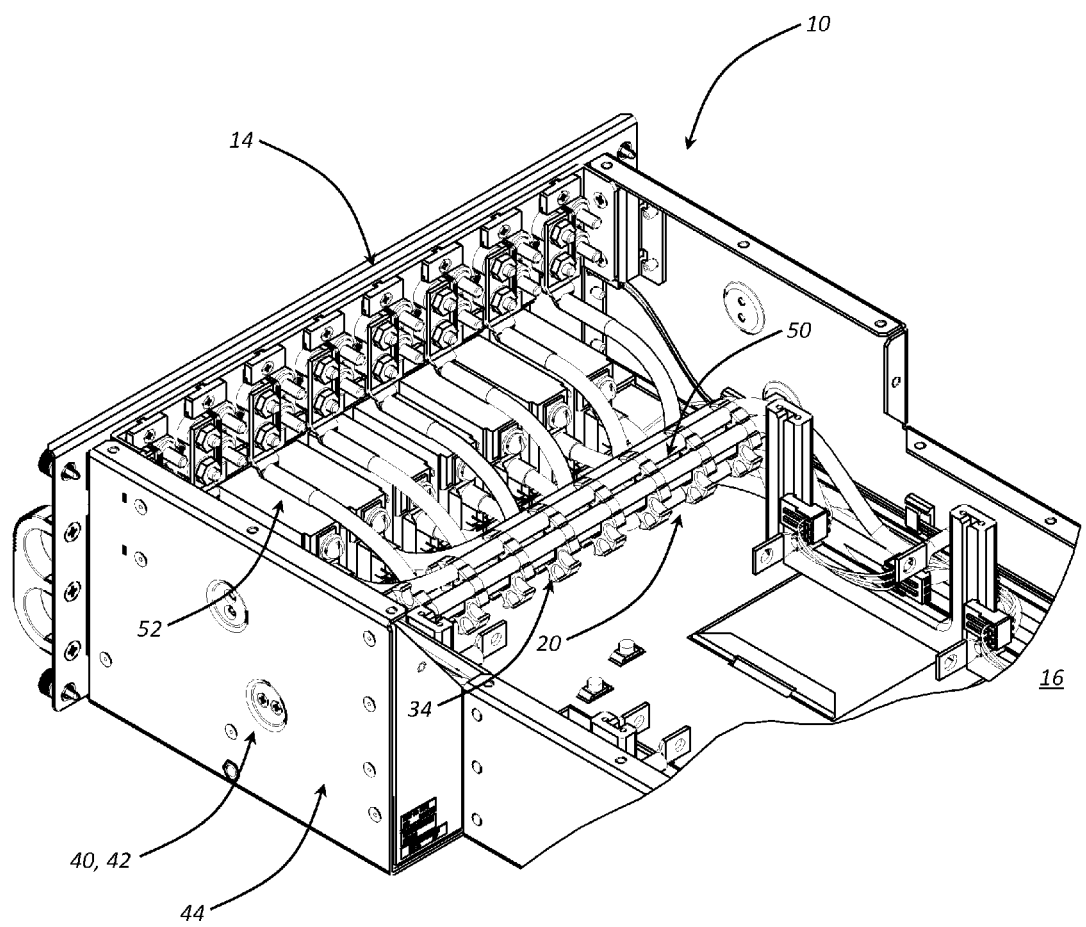
FIG. 4 is a perspective diagram illustrating one exemplary embodiment of the load side power feeds of FIG. 1 routed from the breakers of FIG. 1 through the rotary wire loom assembly of FIG. 2, with the elongate member of FIG. 2 supporting the weight of the wiring.

FIG. 4 is a perspective diagram illustrating one exemplary embodiment of the load side power feeds 12, 50 routed from the breakers 52 through the rotary wire loom assembly 20 of FIG. 2, with the elongate member 24 of FIG. 2 supporting the weight of the wiring. Preferably, each wire 12, 50 is routed from the corresponding breaker 52 and into/through a channel 34 (FIG. 2) of the adjacent annular structure 26 (FIG. 2) of the rotary wire loom assembly 20. The wire 12, 50 is then routed into/through the corresponding channel 34 of each of the annular structures 26 adjacent to the first annular structure 26 to one side or the other, thereby being threaded through and retained by the rotary wire loom assembly 20 until it exits to a termination point of interest directly or indirectly adjacent one end of the rotary wire loom assembly 20. The same is true for each of the wires 12, 50.

Figure 5:
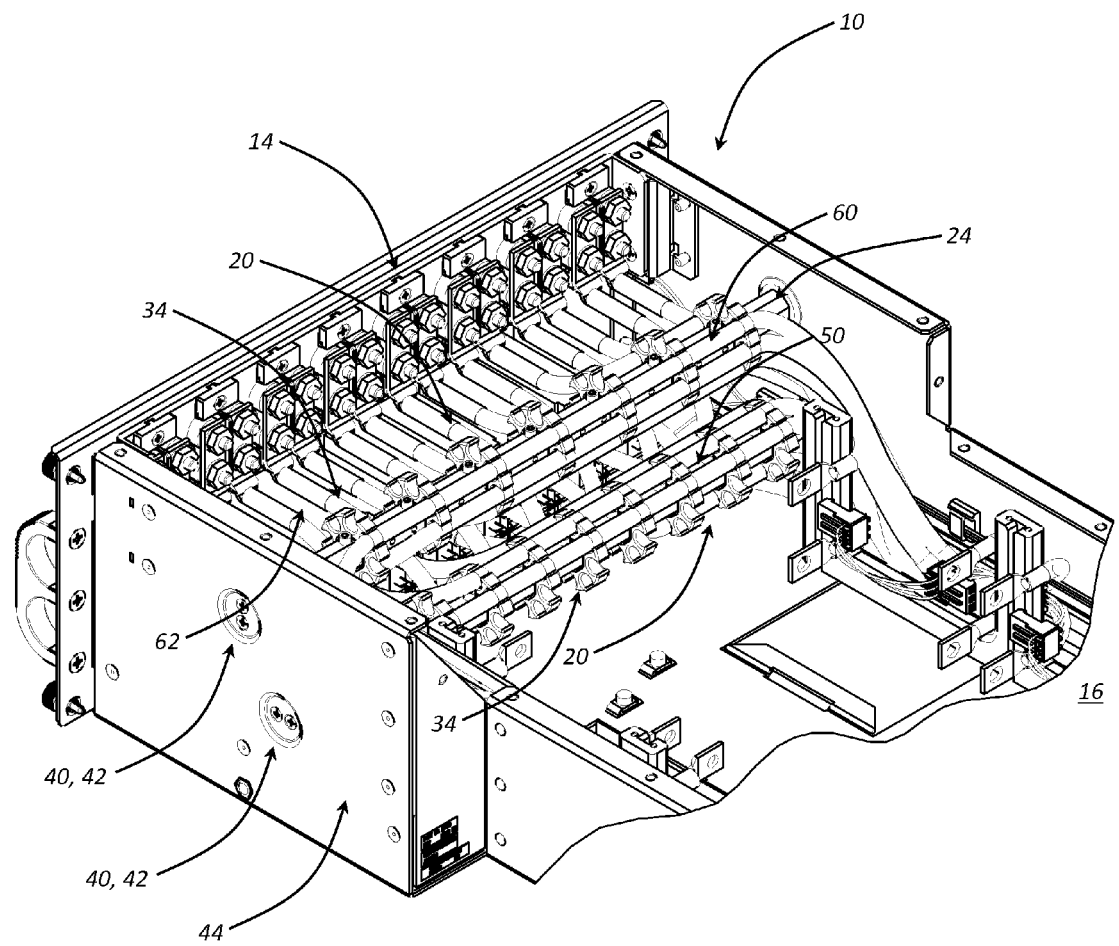
FIG. 5 is a perspective diagram illustrating one exemplary embodiment of the return side power feeds of FIG. 1 routed from the terminal blocks of FIG. 1 through a second rotary wire loom assembly of FIG. 2, with the elongate member of FIG. 2 again supporting the weight of the wiring.

FIG. 5 is a perspective diagram illustrating one exemplary embodiment of the return side power feeds 12, 60 routed from the terminal blocks 62 through a second rotary wire loom assembly 20 of FIG. 2, with the elongate member 24 of FIG. 2 again supporting the weight of the wiring. Preferably, each wire 12, 60 is routed from the corresponding terminal block 62 and into/through a channel 34 (FIG. 2) of the adjacent annular structure 26 (FIG. 2) of the rotary wire loom assembly 20. The wire 12, 60 is then routed into/through the corresponding channel 34 of each of the annular structures 26 adjacent to the first annular structure 26 to one side or the other, thereby being threaded through and retained by the rotary wire loom assembly 20 until it exits to a termination point of interest directly or indirectly adjacent one end of the rotary wire loom assembly 20. The same is true for each of the wires 12, 60. Again, in the exemplary embodiment illustrated, the rotary wire loom assembly 20 spans the PDU 10 from side to side, and is anchored at each side via a raised receiving platform 40 and one or more retention screws 42 that are disposed through the housing 44 of the PDU 10 and into the elongate member 24 of the rotary wire loom assembly 20. Again, it will be readily apparent to those of ordinary skill in the art that other retention mechanisms may also be used to hold the rotary wire loom assembly 20 in a given electronic assembly or the like, provided again that the desired routing of the wires or cables is not interfered with.

Although the present invention has been illustrated and described herein with reference to preferred embodiments and specific examples thereof, it will be readily apparent to those of ordinary skill in the art that other embodiments and examples may perform similar functions and/or achieve like results. For example, the rotary wire loom assembly for routing and retaining high power wires in electronic assemblies and the like of the present invention may take the form of a variety of assemblies for organizing, separating, protecting, and isolating wires, may be utilized in conjunction with a variety of wires or cables, and may be utilized in a variety of applications, not necessarily limited to high power wires in electronic assemblies as illustrated and described. Power antenna applications are one good example of the latter alternative. All such equivalent embodiments and examples are within the spirit and scope of the present invention, are contemplated thereby, and are intended to be covered by the following claims.

What is claimed is:

1. An assembly for routing and retaining wires or cables in an electronic assembly, comprising:
    a non-rotating, horizontally-disposed elongate member;
    a plurality of annular structures each disposed concentrically about the elongate member in a spaced apart relationship, wherein each of the plurality of annular structures defines a plurality of channels about its circumference at its periphery, wherein each of the plurality of channels is configured to receive and retain a wire or cable; and
    a wire or cable disposed in each of the plurality of channels;
    wherein the elongate member is coupled at both ends to a housing of the electronic assembly and is aligned substantially parallel to a front panel of the housing.

2. The assembly of claim 1, wherein the elongate member is disposed within a power distribution unit.

3. The assembly of claim 1, wherein each of the plurality of annular structures comprises a rotary wire loom.

4. The assembly of claim 1, wherein each of the plurality of annular structures comprises an interior surface that is sized and shaped to anti-rotationally engage a corresponding exterior surface of the elongate member.

5. The assembly of claim 1, wherein each of the plurality of channels has a substantially circular cross-sectional shape with an opening at the circumference of the corresponding annular structure.

6. The assembly of claim 5, wherein each of the plurality of channels has a diameter that is slightly smaller than the corresponding diameter of the wire or cable.

7. A method for providing an assembly for routing and retaining wires or cables in an electronic assembly, comprising:
    providing a non-rotating, horizontally-disposed elongate member;
    providing a plurality of annular structures each disposed concentrically about the elongate member in a spaced apart relationship, wherein each of the plurality of annular structures defines a plurality of channels about its circumference at its periphery, wherein each of the plurality of channels is configured to receive and retain a wire or cable; and
    providing a wire or cable disposed in each of the plurality of channels;
    wherein the elongate member is coupled at both ends to a housing of the electronic assembly and is aligned substantially parallel to a front panel of the housing.

8. The method of claim 7, wherein the elongate member is disposed within a power distribution unit.

9. The method of claim 7, wherein each of the plurality of annular structures comprises a rotary wire loom.

10. The method of claim 7, wherein each of the plurality of annular structures comprises an interior surface that is sized and shaped to anti-rotationally engage a corresponding exterior surface of the elongate member.

11. The method of claim 7, wherein each of the plurality of channels has a substantially circular cross-sectional shape with an opening at the circumference of the corresponding annular structure.

12. The method of claim 11, wherein each of the plurality of channels has a diameter that is slightly smaller than the corresponding diameter of the wire or cable.

13. An electronic assembly, comprising:
    an assembly for routing and retaining wires or cables, comprising:
        a non-rotating, horizontally-disposed elongate member;
        a plurality of annular structures each disposed concentrically about the elongate member in a spaced apart relationship, wherein each of the plurality of annular structures defines a plurality of channels about its circumference at its periphery, wherein each of the plurality of channels is configured to receive and retain a wire or cable; and
        a wire or cable disposed in each of the plurality of channels;
        wherein the elongate member is coupled at both ends to a housing of the electronic assembly and is aligned substantially parallel to a front panel of the housing.

14. The electronic assembly of claim 13, wherein the elongate member is disposed within the housing of a power distribution unit.

15. The electronic assembly of claim 13, wherein each of the plurality of annular structures comprises a rotary wire loom.

16. The electronic assembly of claim 13, wherein each of the plurality of annular structures comprises an interior surface that is sized and shaped to anti-rotationally engage a corresponding exterior surface of the elongate member.

17. The electronic assembly of claim 13, wherein each of the plurality of channels has a substantially circular cross-sectional shape with an opening at the circumference of the corresponding annular structure.

18. The electronic assembly of claim 17, wherein each of the plurality of channels has a diameter that is slightly smaller than the corresponding diameter of the wire or cable.

* * * * *